(12) United States Patent
Chhor et al.

(10) Patent No.: US 7,352,199 B2
(45) Date of Patent: Apr. 1, 2008

(54) MEMORY CARD WITH ENHANCED TESTABILITY AND METHODS OF MAKING AND USING THE SAME

(75) Inventors: Khushrav S. Chhor, Fremont, CA (US); Tae-Hee Lee, Saratoga, CA (US)

(73) Assignee: SanDisk Corporation, Milpitas, CA (US)

( * ) Notice: Subject to any disclaimer, the term of this patent is extended or adjusted under 35 U.S.C. 154(b) by 1074 days.

(21) Appl. No.: 09/788,864

(22) Filed: Feb. 20, 2001

(65) Prior Publication Data

US 2002/0116668 A1     Aug. 22, 2002

(51) Int. Cl.
*G01R 31/26* (2006.01)
(52) U.S. Cl. ...................................... 324/765
(58) Field of Classification Search ............... None
See application file for complete search history.

(56) References Cited

U.S. PATENT DOCUMENTS

| | | | |
|---|---|---|---|
| 3,414,892 A | 12/1968 | McCormick et al. | |
| 3,432,827 A | 3/1969 | Samo | |
| 4,489,478 A | 12/1984 | Sakurai | |
| 4,500,905 A | 2/1985 | Shibata | |
| 4,535,424 A | 8/1985 | Reid | |
| 4,630,096 A | 12/1986 | Drye et al. | |
| 4,672,577 A | 6/1987 | Hirose et al. | |
| 4,710,798 A | 12/1987 | Marcantonio | |
| 4,811,082 A | 3/1989 | Jacobs et al. | |
| 5,001,539 A | 3/1991 | Inoue et al. | |
| 5,089,862 A | 2/1992 | Warner, Jr. et al. | |
| 5,160,987 A | 11/1992 | Pricer et al. | |
| 5,191,405 A | 3/1993 | Tomita et al. | |
| 5,192,405 A | 3/1993 | Tomita et al. | |
| 5,202,754 A | 4/1993 | Bertin et al. | |
| 5,266,912 A | 11/1993 | Kledzik | |
| 5,283,468 A | 2/1994 | Kondo et al. | |
| 5,398,200 A | 3/1995 | Mazure et al. | |
| 5,422,435 A | 6/1995 | Takiar et al. | |
| 5,426,566 A | 6/1995 | Beilstein, Jr. et al. | |
| 5,434,745 A | 7/1995 | Shokrgozar et al. | |

(Continued)

FOREIGN PATENT DOCUMENTS

EP          0 073 486          3/1983

(Continued)

OTHER PUBLICATIONS

Dipert, "Exotic memories, diverse approaches," EDN Asia, Sep. 2001, pp. 22-33.

(Continued)

*Primary Examiner*—Ha Tran Nguyen
*Assistant Examiner*—Trung Q. Nguyen
(74) *Attorney, Agent, or Firm*—Kevin L. Daffer; Daffer McDaniel, LLP (57) ABSTRACT

By decreasing the amount of card substrate required in a memory card to support the actual memory unit, the test interface of the card, which is usually removed before final assembly of the card, can be brought within the allowable length of the finished card and can, therefore, remain on the card permanently. Consequently, in the event of a field failure, the test interface remains available for testing the card and diagnosing the location and cause of the failure.

8 Claims, 7 Drawing Sheets

U.S. PATENT DOCUMENTS

| | | | |
|---|---|---|---|
| 5,453,952 A | 9/1995 | Okudaira et al. | |
| 5,455,445 A | 10/1995 | Kurtz et al. | |
| 5,468,997 A | 11/1995 | Imai et al. | |
| 5,481,090 A | 1/1996 | Senock et al. | |
| 5,481,133 A | 1/1996 | Hsu | |
| 5,495,398 A | 2/1996 | Takiar et al. | |
| 5,502,289 A | 3/1996 | Takiar et al. | |
| 5,523,622 A | 6/1996 | Harada et al. | |
| 5,523,628 A | 6/1996 | Williams et al. | |
| 5,552,963 A | 9/1996 | Burns | |
| 5,561,622 A | 10/1996 | Bertin et al. | |
| 5,581,498 A | 12/1996 | Ludwig et al. | |
| 5,585,675 A | 12/1996 | Knopf | |
| 5,612,570 A | 3/1997 | Eide et al. | |
| 5,654,220 A | 8/1997 | Leedy | |
| 5,693,552 A | 12/1997 | Hsu | |
| 5,696,031 A | 12/1997 | Wark | |
| 5,703,747 A | 12/1997 | Voldman et al. | |
| 5,745,407 A | 4/1998 | Levy et al. | |
| 5,780,925 A | 7/1998 | Cipolla et al. | |
| 5,781,031 A | 7/1998 | Bertin et al. | |
| 5,801,437 A | 9/1998 | Burns | |
| 5,915,167 A | 6/1999 | Leedy | |
| 5,969,380 A | 10/1999 | Seyyedy | |
| 5,976,953 A | 11/1999 | Zavracky et al. | |
| 5,985,693 A | 11/1999 | Leedy | |
| 6,003,100 A * | 12/1999 | Lee | 710/301 |
| 6,057,598 A | 5/2000 | Payne et al. | |
| 6,072,234 A | 6/2000 | Camien et al. | |
| 6,087,722 A | 7/2000 | Lee et al. | |
| 6,133,640 A | 10/2000 | Leedy | |
| 6,185,122 B1 | 2/2001 | Johnson et al. | |
| 6,197,641 B1 | 3/2001 | Hergenrother et al. | |
| 6,208,545 B1 | 3/2001 | Leedy | |
| 6,281,042 B1 | 8/2001 | Ahn et al. | |
| 6,291,858 B1 | 9/2001 | Ma et al. | |
| 6,307,257 B1 | 10/2001 | Huang et al. | |
| 6,314,013 B1 | 11/2001 | Ahn et al. | |
| 6,322,903 B1 | 11/2001 | Siniaguine et al. | |
| 6,337,521 B1 | 1/2002 | Masuda | |
| 6,351,028 B1 | 2/2002 | Akram | |
| 6,353,265 B1 | 3/2002 | Michii | |
| 6,355,501 B1 | 3/2002 | Fung et al. | |
| 6,573,567 B1 * | 6/2003 | Nishizawa et al. | 257/358 |
| 6,686,663 B2 * | 2/2004 | Masuda et al. | 257/777 |
| 2001/0033030 A1 | 10/2001 | Leedy | |
| 2001/0054759 A1 | 12/2001 | Nishiura | |
| 2002/0024146 A1 | 2/2002 | Furusawa | |
| 2002/0027275 A1 | 3/2002 | Fujimoto et al. | |
| 2002/0030262 A1 | 3/2002 | Akram | |
| 2002/0030263 A1 | 3/2002 | Akram | |

FOREIGN PATENT DOCUMENTS

| | | |
|---|---|---|
| EP | 0073486 | 4/1989 |
| EP | 0 387 834 | 9/1990 |
| EP | 0387834 | 9/1990 |
| EP | 0 395 886 | 11/1990 |
| EP | 0395886 | 11/1990 |
| EP | 0 516 866 | 12/1992 |
| EP | 0516866 | 12/1992 |
| EP | 0 606 653 | 7/1994 |
| EP | 0606653 | 7/1994 |
| EP | 0 644 548 | 3/1995 |
| EP | 0644548 | 3/1995 |
| EP | 0 800 137 | 10/1997 |
| EP | 0800137 | 10/1997 |
| JP | 60-22352 | 2/1985 |
| JP | 61-222216 | 10/1986 |
| JP | 63-52463 | 3/1988 |
| WO | 94/26083 | 11/1994 |

OTHER PUBLICATIONS

Akasaka, "Three-dimensional integrated circuit: technology and application prospect," Microelectronics Journal, Vol. 20, Nos. 1-2, 1989, pp. 105-112.

Sakamoto, "Architecture des Circuits è Trois Dimensions," Bulletin of the Electrotechnical Laboratory, vol. 51, No. 1, 1987, pp. 16-29.

Akasaka, "Three-Dimensional IC Trends," Proceedings of the IEEE, Vol. 74, No. 12, 1986, pp. 1703-1714.

Pein et al., "Perfromance of the 3-D Pencil Flash EPROM Cell and Memory Array," IEEE Transactions on Electron Devices, vol. 42, No. 11, 1995, pp. 1982-1991.

Jokerst et al., "Manfacturable Multi-Material Integration: Compound Semiconductor Devices Bonded to Silicon Circuitry," SPIE Vol. 2524, 1995, pp. 152-163.

Camperi-Ginestet et al., "Vertical Electrical Interconnection of Compound Semiconductor Thin-Film Devices to Underlying Silicon Circuitry," IEEE Photonics Technology Letters, vol. 4, No. 9, 1992, pp. 1003-1006.

Lomatch et al., "Multilayered Josephson junction logic and memory devices," SPIE vol. 2157, 1994, Abstract Only, 2 pgs.

Lu, "Advanced cell structures for dynamic RAMs," IEEE Circuits and Devices, vol. 5, No. 1, 1989, Abstract Only, 2 pgs.

Sakamoto, "Architecture of three dimensional devices," Bulletin of the Electrotechnical Laboratory, vol. 51, No. 1, 1987, Abstract Only, 2 pgs.

"Wide application of low-cost associative processing seen," Electronic Engineering Times, 1996, 6 pgs.

"Interconnects & Packaging," Electronic Engineering Times, 1996, 8 pgs.

"Closing in on gigabit DRAMs," Electronic Engineering Times, 1995, 4 pgs.

"Module Pact Pairs Cubic Memory with VisionTek," Semiconductor Industry & Business Survey, vol. 17, No. 15, 1995, 2 pgs.

Flaherty, "Layers of BST materials push toward 1Gbit DRAM," Electronic Times, 1995, 3 pgs.

Santoni, "Technologies Will Pursue Higher DRAM Densities," Electronic News, 1991, 7 pgs.

Weber, "Looking for diverse storage,", Electronic Engineering Times, 1994, 7 pgs.

"Special Report: Memory Market Startups, Cubic Memory: 3D Space Savers," Semiconductor Industry & Business Survey, vol. 16, No. 13, 1994, 6 pgs.

Bindra, "Technique boosts 3D memory density," Electronic Engineering Times, 1994, 2 pgs.

Bindra, "Memory packs poised for 3-D use," Electronic Engineering Times, 1992, 4 pgs.

Derman, "MCMs hit the road," Electronic Engineering Times, 1992, 6 pgs.

Bindra, "IEDM ponders the 'gigachip' era," Electronic Engineering Times, 1992, 4 pgs.

"Tech Watch: 1-Gbit DRAM in sight," Electronic World News, 1991, 2 pgs.

Derman, "MCMs meld into systems," Electronic Engineering Times, 1991, 7 pgs.

Brown, "Systems EEs see future in 3-D," Electronic Engineering Times, 1990, 4 pgs.

Hayashi et al., "A New Three Dimensional IC Fabrication Technology, Stacking Thin Film Dual CMOS Layers," © 1991 IEEE, 4 pgs.

Tielert, "Benefits of Vertically Stacked Integrated Circuits for Sequential Logical," © 1996 IEEE, pp. 121-124.

Stern et al., "Design and Evaluation of an Epoxy Three-Dimensional Multichip Module," IEEE Transactions on Components, Packaging, and Manufacturing Technology-Part B, vol. 19, No. 1, 1996, pp. 188-194.

Bertin et al., "Evaluation of a Three-Dimensional Memory Cube System," IEEE Transactions on Components, Hybrids, and Manufacturing Technology, vol. 16, No. 8, 1993, pp. 1006-1011.

Watanabe et al., "Stacked Capacitor Cells for High-density dynamic RAMs," © 1988 IEEE, pp. 600-604.

"Stacked Memory Modules," IBM Technical Disclosure Bulletin, vol. 38, No. 5, 1995, 2 pgs.

"3-D Chip-on-chip Stacking," Semiconductor International, 1991, 1 pg.

Thakur et al., "An Optimal Layer Assignment Algorithm for Minimizing Crosstalk for Three Layer VHV Channel Routing," © IEEE, pp. 207-210.

Terrill et al., "3D Packaging Technology Overview and Mass Memory Applications," ©1996 IEEE, pp. 347-355.

Suguhara et al., "A Three-Dimensional Static RAM," IEEE Electron Device Letters, vol. EDL7, No. 5, 1986, pp. 327-329.

Tielert, "Benefits of Vertically Stacked Integrated Circuits for Sequential Logic," © 1996 IEEE, pp. 121-124.

Akasaka, "Three-Dimensional IC Trends," ©1986 IEEE, pp. 1703-1714.

Kurokawa et al., "3-D VLSI Technology in Japan and an Example: a Syndrome Decoder for Double Error Correction," Future Generation Computer Systems, vol. 4, No.2, 1988, pp. 145-155.

Maliniak, "Memory-Chip Stacks Send Density Skyward," Electronic Design, vol. 42, No. 17, 1994, 5 pgs.

Schlaeppi et al., "Submicrosecond Core Memories Using Multiple Coincidence," IRE Transactions on Electronic Computers, 1960, pp. 192-198.

Schlaeppi et al., "Submicrosecond Core Memories Using Multiple Coincidence," 1960 International Solid State Circuits Conference, pp. 54-55.

Lay, "TRW Develops Wireless Multiboard Interconnect System," Electronic Engineering Times, 1984, 1 pg.

Yamazaki et al., "Fabrication Technologies for Dual 4-Kbit Stacked SRAM," © 1986 IEEE, pp. 435-438.

Akasaka, "Three-dimensional integrated circuit: technology and application prospect," Microelectronics Journal, vol. 20, Nos. 1-2, 1989, pp. 105-112.

Sakamoto, "Architure des Circuits à Trois Dimensions," Bulletin of the Electrotechnical Laboratory, vol. 51, No. 1, 1987, pp. 16-29.

Akasaka, "Three-Dimensional IC Trends," Proceedings of the IEEE, vol. 74, No. 12, 1986, pp. 1703-1714.

Pein et al., "Performance of the 3-D Pencil Flash EPROM Cell and Memory Array," IEEE Transactions on Electron Devices, vol. 42, No. 11, 1995, pp. 1982-1991.

Jokerst et al., "Manfacturable Multi-Material Integration: Compound Semiconductor Devices Bonded to Silicon Circuitry," SPIE vol. 2524, 1995, pp. 152-163.

Camperi-Ginestet et al., "Vertical Electrical Interconnection of Compound Semiconductor Thin-Film Devices to Underlying Silicon Circuitry," IEEE Photonics Technology Letters, vol. 4, No. 9, 1992, pp. 1003-1006.

Lomatch et al., "Multilayered Josephson junction logic and memory devices," SPIE vol. 2157, 1994, Abstract Only, 2 pgs.

Lu, "Advanced cell structures for dynamic RAMs," IEEE Circuits and Devices, vol. 5, No. 1, 1989, Abstract Only, 2 pgs.

Sakamoto, "Architecture of three dimensional devices," Bulletin of the Electrotechnical Laboratory, vol. 51, No. 1, 1987, Abstract Only, 2 pgs.

"Wide application of low-cost associative processing seen," Electronic Engineering Times, 1996, 6 pgs.

"Interconnects & Packaging," Electronic Engineering Times, 1996, 8 pgs.

"Closing in on gigabit DRAMs," Electronic Engineering Times, 1995, 4 pgs.

"Module Pact Pairs Cubic Memory with VisionTek," Semiconductor Industry & Business Survey, vol. 17, No. 15, 1995, 2 pgs.

Flaherty, "Layers of BST materials push toward 1Gbit DRAM," Electronic Times, 1995, 3 pgs.

Santoni, "Technologies Will Pursue Higher DRAM Densities," Electronic News, 1991, 7 pgs.

Weber, "Looking for diverse storage," Electronic Engineering Times, 1994, 7 pgs.

"Special Report: Memory Market Startups, Cubic Memory: 3D Space Savers," Semiconductor Industry & Business Survey, vol. 16, No. 13, 1994, 6 pgs.

Bindra, "Technique boosts 3D memory density," Electronic Engineering Times, 1994, 2 pgs.

Bindra, "Memory packs poised for 3-D use," Electronic Engineering Times, 1992, 4 pgs.

Derman, "MCMs hit the road," Electronic Engineering Times, 1992, 6 pgs.

Bindra, "IEDM ponders the 'gigachip' era," Electronic Engineering Times, 1992, 4 pgs.

"Tech Watch: 1-Gbit DRAM in sight," Electronic World News, 1991, 2 pgs.

Derman, "MCMs meld into systems," Electronic Engineering Times, 1991, 7 pgs.

Brown, "Systems EEs see future in 3-D," Electronic Engineering Times, 1990, 4 pgs.

Hayashi et al., "A New Three Dimensional IC Fabrication Technology, Stacking Thin Film Dual CMOS Layers," © 1991 IEEE, 4 pgs.

Tielert, "Benefits of Vertically Stacked Integrated Circuits for Sequential Logic," © 1996 IEEE, pp. 121-124.

Stern et al., "Design and Evaluation of an Epoxy Three-Dimensional Multichip Module," IEEE Transactions on Components, Packaging, and Manufacturing Technology-Part B, vol. 19, No. 1, 1996, pp. 188-194.

Bertin et al., "Evaluation of a Three-Dimensional Memory Cube System," IEEE Transactions on Components, Hybrids, and Manufacturing Technology, vol. 16, No. 8, 1993, pp. 1006-1011.

Watanabe et al., "Stacked Capacitor Cells for High-density dynamic RAMs," © 1988 IEEE, pp. 600-604.

"Stacked Memory Modules," IBM Technical Disclosure Bulletin, vol. 38, No. 5, 1995, 2 pgs.

"3-D Chip-on-chip Stacking," Semiconductor International, 1991, 1 pg.

Thakur et al., "An Optimal Layer Assignment Algorithm for Minimizing Crosstalk for Three Layer VHV Channel Routing," © 1995 IEEE, pp. 207-210.

Terrill et al., "3D Packaging Technology Overview and Mass Memory Applications," © 1996 IEEE, pp. 347-355.

Sugahara et al., "A Three-Dimensional Static RAM," IEEE Electron Device Letters, vol. EDL7, No. 5, 1986, pp. 327-329.

Tielert, "Benefits of Vertically Stacked Integrated Circuits for Sequential Logic," © 1996 IEEE, pp. 121-124.

Akasaka, "Three-Dimensional IC Trends," © 1986 IEEE, pp. 1703-1714.

Kurokawa et al., "3-D VLSI Technology in Japan and an Example: a Syndrome Decoder for Double Error Correction," Future Generation Computer Systems, vol. 4, No. 2, 1988, pp. 145-155.

Maliniak, "Memory-Chip Stacks Send Density Skyward," Electronic Design, vol. 42, No. 17, 1994, 5 pgs.

Schlaeppi et al., "Submicrosecond Core Memories Using Multiple Coincidence," IRE Transactions on Electronic Computers, 1960, pp. 192-198.

Schlaeppi et al., "Submicrosecond Core Memories Using Multiple Coincidence," 1960 International Solid State Circuits Conference, pp. 54-55.

Lay, "TRW Develops Wireless Multiboard Interconnect System," Electronic Engineering Times, 1984, 1 pg.

Yamazaki et al., "Fabrication Technologies for Dual 4-Kbit Stacked SRAM," © 1986 IEEE, pp. 435-438.

* cited by examiner

MEMORY CARD WITH ENHANCED TESTABILITY AND METHODS OF MAKING AND USING THE SAME

FIELD OF THE INVENTION

The present invention relates to the field of semiconductor memory cards that can be used to extend the memory available to a wide variety of electronic devices that capture or use electronic data. More specifically, the present invention relates to a memory card with enhanced testability so that upon failure, particularly a failure in the field, the card can be examined and tested so that the source of, or reason for, the failure can be identified to improve the reliability and quality of subsequently manufactured cards.

BACKGROUND OF THE INVENTION

Memory cards are flat memory units that incorporate semiconductor memory in a casing called a skin. A memory card may be about the size of a postage stamp, a matchbook or a credit card. Memory cards also include electrical contacts or connectors so that the memory in the card can be connected to a device that captures or uses digital data, for example, a digital camera. In this way, memory cards provide primary or additional memory capacity for the host device in much the same way that floppy disks provide additional memory capacity for computers.

Memory cards are typically non-volatile, meaning that they do not require power to maintain the data stored on them. Memory cards are also solid-state, semiconductor devices. Consequently, there are no moving parts to skip or break down while the stored data is being retrieved. Memory cards offer relatively high storage capacity, recently 32 to 64 MB. Capacities of up to 128 MB and 256 MB are expected in the near future. Memory cards also provide fast data transfer rates, security features and easy storage of data given the small size of the cards.

Memory cards can be used with, for example, digital cameras, music players known as MP3 players, personal digital assistants, game machines, wireless telephones, digital voice recorders, printers and other computer peripherals. Memory cards can also be placed in adapters and interfaced with personal computers like other computer memory cards.

There are many examples of memory cards that conform to different standards. Examples of memory cards include Secure Digital ("SD") memory cards made by Matsushita, Toshiba and SanDisk Corporation; Multi-Media Cards ("MMC"); SmartMedia™ or SSFDC made by Toshiba; CompactFlash™ ("CF") cards produced by SanDisk Corporation and Memory Stick® produced by Sony Corporation. The standards for different types of cards are usually set by industry associations. Information about memory cards and the associations that establish standards can be found at the following websites: http://www.sdcard.org/; http://www.compactflash.org/; and http://www.ssfdc.or.jp/english/index.htm.

Figure 1A:
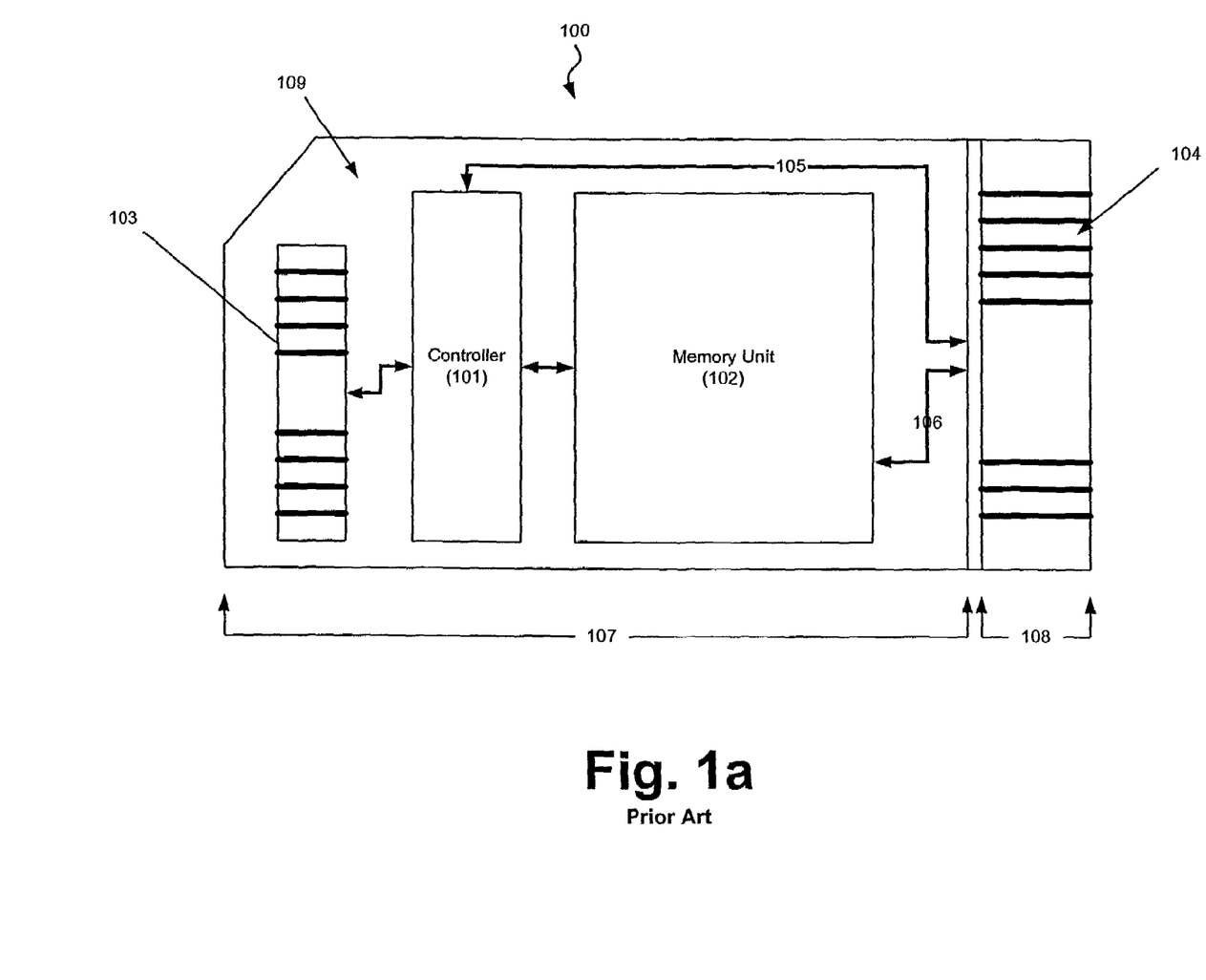
FIGS. 1*a* and 1*b* illustrate a conventional memory card at various stages of the manufacturing process.

FIG. 1a illustrates a block diagram of a generalized memory card (100) during the process of manufacturing the card. As shown in FIG. 1, the typical memory card (100) includes, of course, a memory unit (102). The bulk of the memory card's real estate is used by the memory unit (102). A controller (101) may also be provided for controlling the storing of data to and the retrieval of information from the memory unit (102).

A main interface (103) electrically connects the components on the card (100) with whatever host device the card (100) is being used with. The main interface (103) typically includes a number, e.g. eight, of pins or contact pads that are brought into contact with, and thus electrically connected to, the data lines of the host device (not shown).

The various elements of the memory card (100) are formed on a substrate (109). The substrate (109) may be a printed circuit board or a semiconductor chip. The elements of the memory card, particularly the memory unit or units can be formed or mounted on one or both sides of the substrate (109).

As shown in FIG. 1a, access to the memory unit (102), via the main interface (103) is through the controller (101). During manufacture, a second interface, called the test interface (104) is formed on the substrate (109). The test interface (104) provides a direct connection (106) to the memory unit (102) as well as a direct connection (105) to the controller (101). Consequently, the test interface (104) provides more direct access to the components of the memory card (100) than is provided through the main interface (103).

As the card (100) is completed, the test interface (104) of the card (100) can be inserted into a slot or socket of testing equipment, such as a test computer. The test computer can then access and test the various components on the card (100) to enhance quality and reliability.

Because each type of memory card (100) can be used with different devices, there must be some standard for, at least, the various types of cards. Consequently, as mentioned above, industry associations or particular manufacturers set various standards for types of memory cards.

As shown in FIG. 1a, the permissible length for the card (100) given the applicable standards is illustrated as length (107). In order to maximize the memory capacity of the card (100), as much of this length as possible may be devoted to the memory unit (102). In fact, as shown in FIG. 1a, the test interface (104) extends a length (108) beyond the allowed length (107) of the card.

Figure 1B:
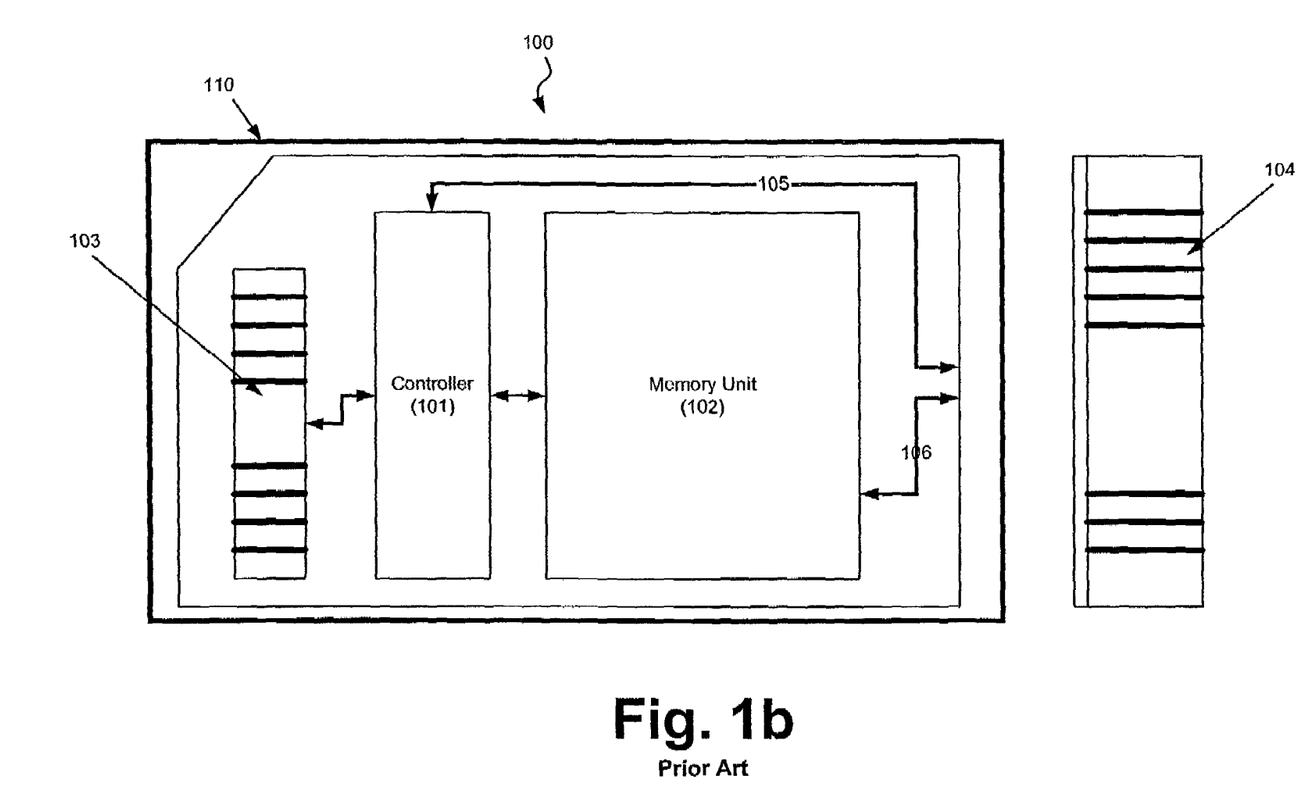

Consequently, as shown in FIG. 1b, once testing of the card (100) is completed, the test interface (104) is severed from the card (100). Molding may then be used to complete the components on the card (100), and the card (100) is then encased in a casing (110) known as a "skin." The skin may be made, for example, of plastic or metal.

Problems, however, may still arise on the card (100). For example, a connection on the card (100) may fail or become broken, memory cells in the memory unit (102) may malfunction, or the controller (101) may malfunction. Any of these malfunctions may be caused by defects in the manufacturing process. Additionally, if a new circuit design is being implemented in a card (100), there may be bugs in the design that have gone undiscovered until the design is implemented.

Consequently, it is extremely useful to card manufacturers to be able to ascertain the location and, ultimately, the cause of any failure in the card (100). However, once the card (100) has been encased in the skin (110) and placed in service, the test interface (104) is gone and the card can only be tested by less direct methods using the main interface (103). Thus, what is called a "field failure" or a failure of the card (100) in the field when it is in use, can be very difficult to diagnose.

Consequently, there is a need in the art for an improved means of testing memory cards and diagnosing memory card failures, particularly after the card has been placed in service, i.e. a field failure.

SUMMARY OF THE INVENTION

The present invention meets the above-described needs and others. Specifically, the present invention provides an improved means of testing memory cards and diagnosing memory card failures, particularly after the card has been placed in service, i.e. a field failure.

Additional advantages and novel features of the invention will be set forth in the description which follows or may be learned by those skilled in the art through reading these materials or practicing the invention. The advantages of the invention may be achieved through the means recited in the attached claims.

The present invention may be embodied and described as a memory card composed of a substrate bearing a memory unit; a skin enclosing the substrate; a main interface disposed on the substrate; and a test interface, separate from the main interface, also disposed on the substrate. With the test interface remaining on the memory card after the card is encased in the skin, the skin can be opened to provide access to the test interface for optimal testing of the memory card, even following a field failure.

A molded material required to complete the components on the substrate is preferably molded so that the test interface protrudes from the molded material to form an edge connector. The skin also includes an opening exposing the main interface so that the memory card can be used by a host device to which it is connected.

Preferably, the memory card of the present invention also includes direct connections between a controller on the substrate and the test interface. At least one electrical connection also runs directly between the test interface and the memory unit. In this way, the test interface has better access to the controller and memory unit for testing those components than would be available through the main interface. Alternatively, the controller may be integrated with either the memory unit or the host device.

At least one electrical connection is also formed directly between the main interface and the memory unit. This connection is also electrically connected to the test interface to provide further testing capabilities. In addition to these connections, the memory card also preferably includes at least one electrical connection running between the memory unit and the controller on the substrate. This electrical connection is also connected to the test interface.

The present invention also encompasses the methods of making and using the memory card described above. Specifically, the present invention encompasses a method of making a memory card by enclosing a substrate of the memory card in a skin of the memory card without removing a test interface from the substrate. In other words, the present invention encompasses a method of making a memory card by enclosing a substrate of the memory card in a skin of the memory card, where the substrate enclosed by the skin includes a memory unit, a main interface and a test interface, separate from the main interface.

The present invention also encompasses the method of testing the memory card described above, particularly after a field failure. Specifically, the present invention encompasses a method of testing a memory card by opening the skin of the memory card to expose an edge connector on a substrate of the memory card, the edge connector being separate from a main interface of the memory card; and connecting the edge connector to test equipment for testing the memory card.

BRIEF DESCRIPTION OF THE DRAWINGS

The accompanying drawings illustrate preferred embodiments of the present invention and are a part of the specification. Together with the following description, the drawings demonstrate and explain the principles of the present invention.

Throughout the drawings, identical elements are designated by identical reference numbers.

DETAILED DESCRIPTION OF THE PREFERRED EMBODIMENTS

The present invention is an improved memory card which provides better means for testing the card following a failure, particularly a field failure, to improve subsequently manufactured memory cards. As described above, memory cards are solid-state, semiconductor devices that provide primary or additional memory for electronic devices that use digital data. Memory cards are typically non-volatile, meaning that they do not require power to maintain the data stored on them. However, within the scope of the present invention, memory cards may be volatile memory that could be used, for example, to increase the memory on a laptop or personal digital assistant.

The present invention can make use of several earlier inventions which, like the present invention, have been assigned to Matrix Semiconductor, Inc. of Santa Clara, Calif. These previous inventions are the subject of U.S. Pat. Nos. 6,034,882 and 6,185,122, both entitled "Vertically Stacked Field Programmable Nonvolatile Memory and Method of Fabrication" to Johnson, et al. and U.S. patent application Ser. No. 09/560,626 filed Apr. 28, 2000 by Johan Knall and entitled "Three Dimensional Memory Array and Method of Fabrication." These three documents are incorporated herein by reference in their entireties. As described and claimed in these patents, it is possible to fabricate multiple layers of memory that are stacked vertically in, for example, a memory card. Consequently, the memory capacity of the card can be increased while at the same time decreasing the X-Y real estate required for the memory unit on the card's substrate.

Using the drawings, the preferred embodiments of the present invention will now be explained. Stated generally, by decreasing the amount of the card substrate required to support the memory unit, the test interface of the card can be brought within the allowable length of the finished card and can, therefore, remain on the card permanently. Consequently, in the event of a field failure, the test interface remains available for testing the card and diagnosing the location and cause of the failure.

Figure 2:
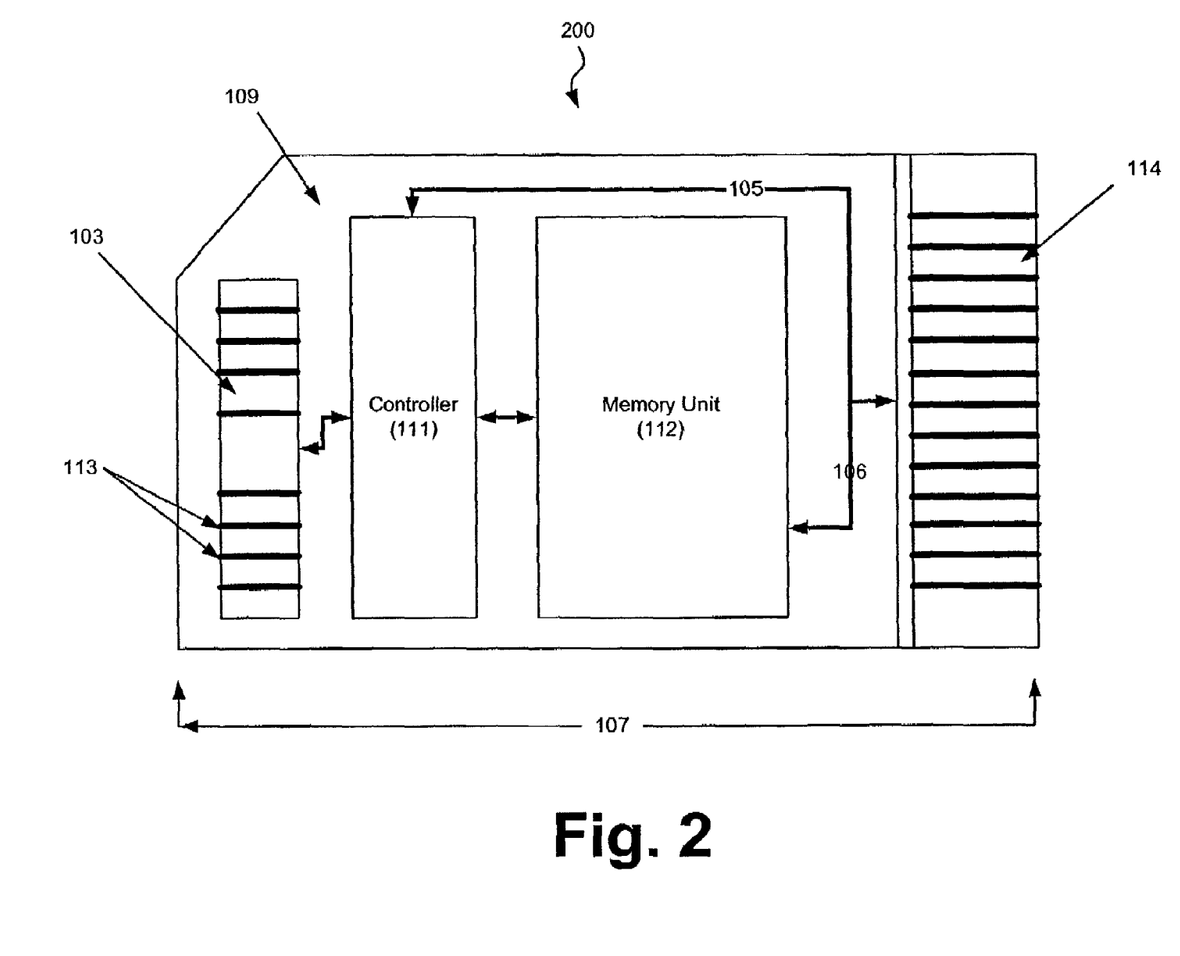
FIG. 2 illustrates an improved memory card according to the present invention without the card's skin.

FIG. 2 illustrates a preferred embodiment of an improved memory card according to the principles of the present invention. As shown in FIG. 2, the memory card (200) of the present invention includes a main interface (103), a controller (111) and a memory unit (112). The main components of the card (200), such as the controller (111) and the memory unit (112), may be referred to as dice (singular, "die"). These components may also be fabricated as separate chips and connected to the substrate (109) e.g., a printed circuit board, to form the card. Such chips are referred to as "Chips on Board" (COBs).

As before, the main interface (103) provides electrical access to the card (200) for the host device with which the card is used. In one embodiment, the main interface (103) includes seven, nine, 22 or 50 pins or electrical contacts (113) that can be connected to the data lines of the host device (not shown).

Typically, the card (200) is inserted in a slot in the host device which includes contacts or connectors for receiving the main interface (103). As noted above, memory cards can be used with, for example, digital cameras, music players (e.g., MP3 players), personal digital assistants, game machines, wireless telephones, digital voice recorders, printers and other computer peripherals. Memory cards can also be placed in adapters and interfaced with personal computers like other computer memory cards. Additional uses of memory cards are certain to be developed in the future, and the present invention is not limited to a particular application.

The memory unit (112) is not necessarily a singular device. The memory unit (112) can be composed of any number of discrete memory units. Additionally, consistent with the disclosure of U.S. Pat. Nos. 6,034,882 and 6,185,122, the memory unit (112) may be a multi-level memory device with memory arrays stacked vertically on the substrate (109).

In any event, the memory unit (112) is, under the principles of the present invention, reduced in size, but not necessarily capacity, so that it requires less of the area of the substrate (109) as compared to prior art devices. This reduction in size can be accomplished in several ways. For example, the memory capacity of the card (200) can be decreased. Preferably, the capacity of the card is maintained or increased and the memory unit (112) includes multiple vertically stacked memory layers. Additionally, there is an emerging technology that allows the mounting of one memory chip on top of another memory chip on a memory card. This may include components packaged in plastic packages and then soldered on the substrate (e.g., a printed circuit board), a chip-on-board which is a die attached and wire bonded to the substrate, a flip-chip assembly in which the die has bumped pads and is then soldered directly onto the substrate (e.g., a printed circuit board). Alternatively, as technology advances, memory devices may continue to shrink so that it becomes possible to put a single-layer memory unit of comparable capacity on less substrate area.

The present invention can be practiced under any of these circumstances in which the area required by the memory unit (112) is decreased. With the decrease in size of the memory unit (112), the substrate (109) is also shortened so as to bring the test interface (114) within the length (107) allowed by the applicable standard for a finished memory card. This is illustrated in FIG. 2.

Figure 3:
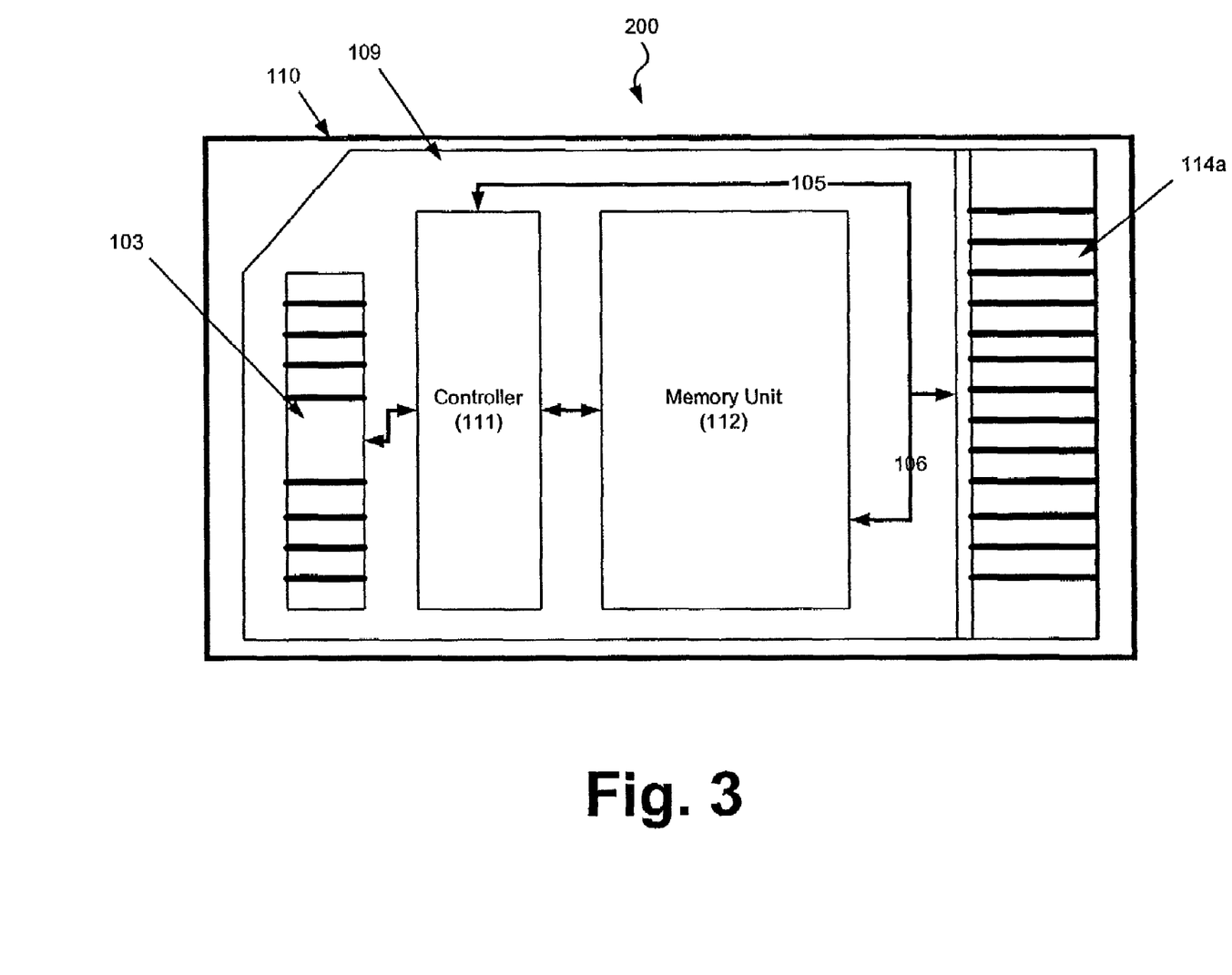
FIG. 3 illustrates the components of the card of FIG. 2 after the card has been encased in the skin.
Figure 4:
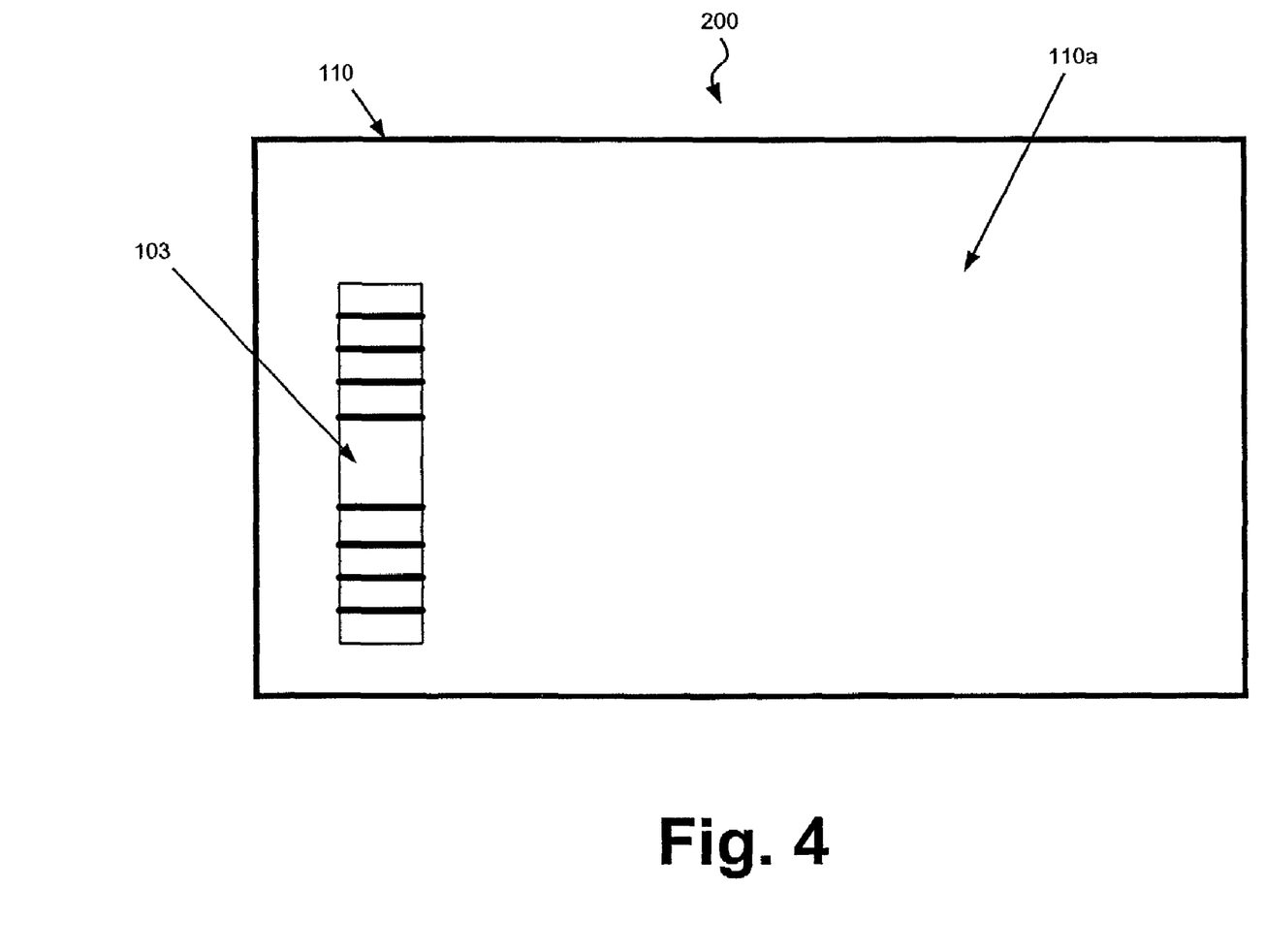
FIG. 4 illustrates the main interface of the card of FIG. 3 which is accessible through an opening in the skin.

FIG. 3 illustrates the memory card (200) of FIG. 2 after the components on the substrate (109) have been completely formed and the card (200) has been encased in a skin (110). As noted above, the skin (110) is a casing for the card that is typically made from metal or plastic. FIG. 4 also illustrates an assembled card (200), including the skin (110). As shown in FIG. 4, a surface (110a) of the skin (110) includes a window or opening through which the main interface (103) remains accessible to the device using the memory card (200).

Figure 4A:
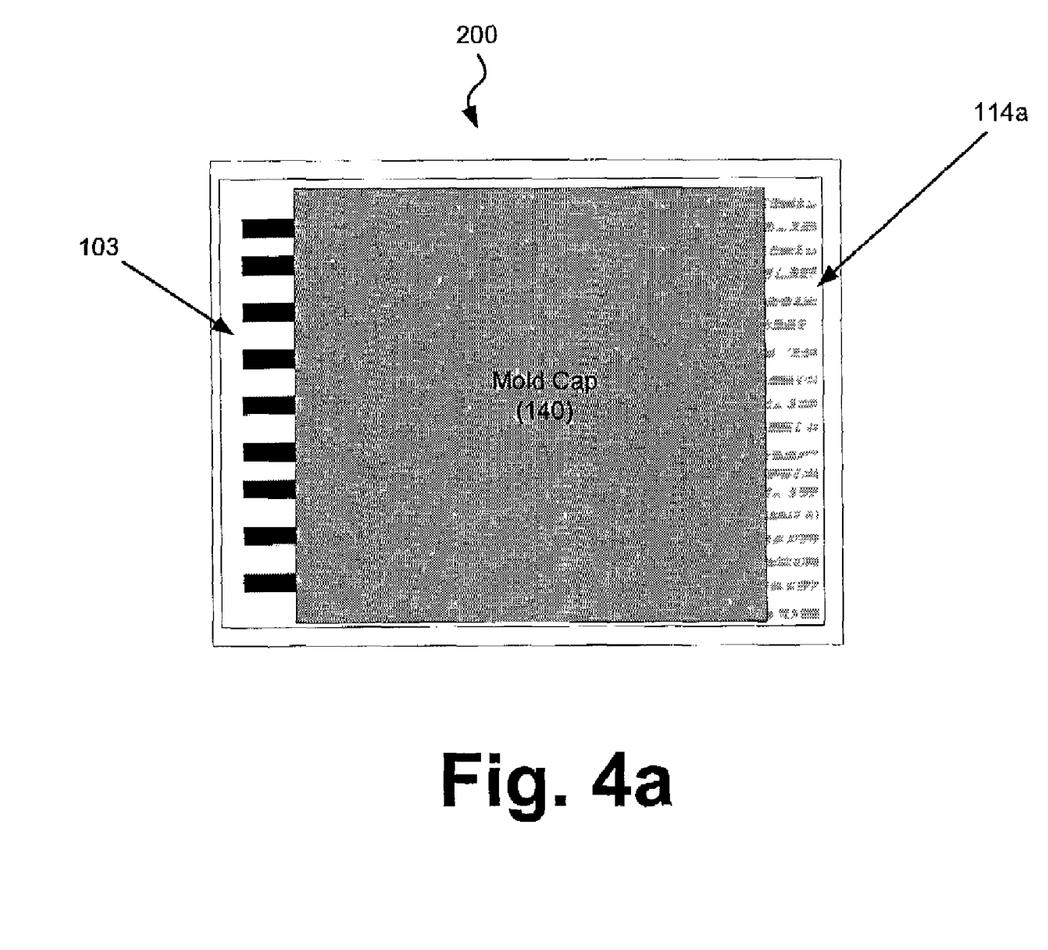
FIG. 4*a* illustrates the substrate of the memory card of FIG. 2 with the mold cap in place.

Before the card (200) is placed in the skin (110), completion of the card and some components of the card (200) may require that material be molded on the substrate (109). As this molding is performed, care is taken to ensure that the test interface (114) is not covered and rendered inaccessible. Consequently, as shown in FIG. 4a, the test interface protrudes from any molded material (e.g., the mold cap (140)) on the substrate (109) and is then referred to as edge connector (114a). The card (200) is then placed in the skin (110).

In the event of a failure of the card (200), particularly a field failure, the skin (110) can be opened and the edge connector (114a) accessed. With the edge connector (114a) accessible, the card (200) can be connected to the same test equipment used during manufacture. The memory unit (112) and controller (111) can be then directly accessed by the test equipment (not shown) using the connections (105 and 106) that will be described in more detail below. Consequently, the location and cause of the failure can be much more readily and accurately diagnosed than if only the main interface (103) were available to test the card (200). Thus, the present invention provides great advantages over the prior art in the ability to test a memory card (200) and, consequently, improve the manufacturing process based on the data revealed by the tests.

Figure 5:
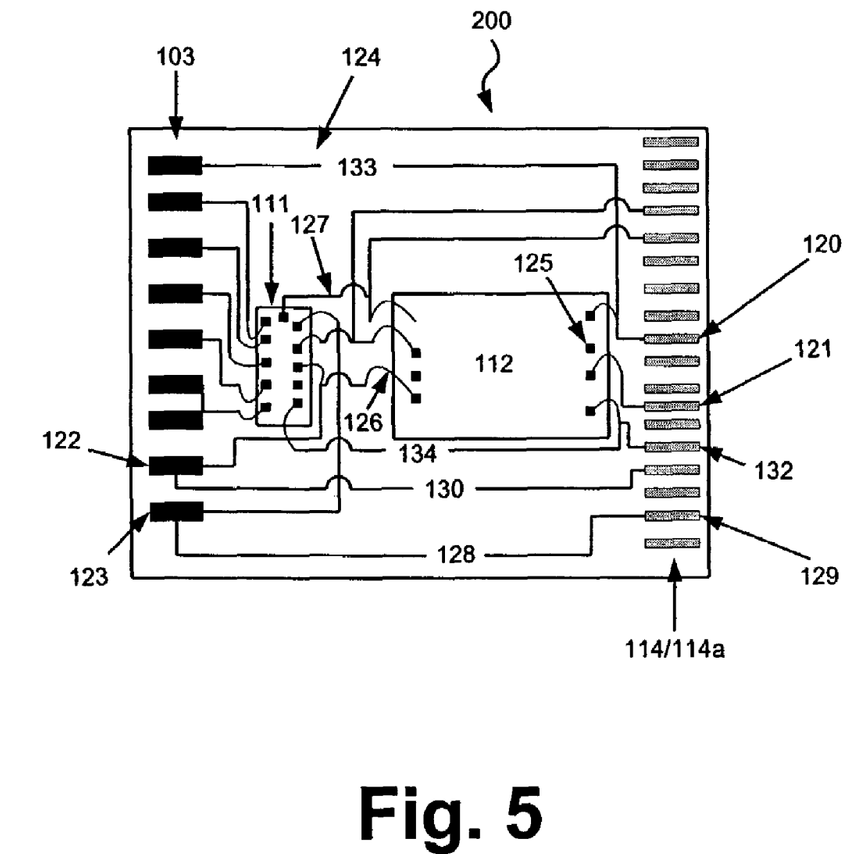
FIG. 5 provides a more detailed view of the components and the connections between components of a memory card according to the present invention.

FIG. 5 illustrates a preferred arrangement for the connections on the card (200) so as to maximize the usefulness of the edge connector (114a) during subsequent testing of the card (200). As shown in FIG. 5, there are connections (127) on the substrate, for example, printed connections on a printed circuit board (124). These connections (e.g., 127) are connected by wire, pin and or/solder (e.g., 126) to the electrical inputs (e.g., 125) of the dice, e.g., the controller (111) and memory unit (112). These connections (e.g., 127) typically provide links between the main interface (103) and the controller (111) and between the controller (111) and the memory unit (112).

Preferably, the pins or connectors (e.g., 123) of the main interface (103) may be connected (e.g., 128) to pins or connectors (e.g., 129) of the edge connector (114a). Consequently, the edge connector (114a) can be used to route signals through the main interface (103) as well as directly to other card components. In this way, the connections between the main interface (103) and the other card components (e.g., 111, 112) can be tested using the edge connector (114a).

Pin (122) of the main interface (103) is connected to both the controller (111) and the memory unit (112). This connection may provide power or ground for the dice (111, 112). Pin (122) is also connected (130) to the edge connector (114a) and can, therefore, be tested through the edge connector. Also power or grounding can be provided for the dice (111, 112) through the edge connector (114a) via the connection (130) during testing.

Pin (121) of the edge connector (114a) is connected directly to the memory unit (112) and illustrates that the edge connector (114a) can have such direct connections with the memory unit (112) to better test the memory unit (112). Pin (120) is also connected directly to the memory unit (112) at a location where the main interface (103) also connects directly to the memory unit (112). Where such is the case, pin (120) can also be used to test the reliability of any connection (e.g., 133) that runs directly between the main interface (103) and the memory unit (112).

Pin (132) of the edge connector (114a) is connected to a connection (134) that runs between the controller (111) and the memory unit (112). Consequently, pin (132) can be used to test the communication between the dice (111, 112) on connection (134).

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims and all legal equivalents thereto.

What is claimed is:

1. A memory card comprising:
   a substrate comprising a memory unit and a memory controller;
   a skin enclosing said substrate;
   a main interface disposed on said substrate; and
   a test interface, separate from said main interface, disposed on said substrate and having at least one electrical connection that extends directly between the test interface and the memory unit, absent any intervening electrical connection to the memory controller; and
   an opening in said skin exposing said main interface and also said test interface for testing the memory card for field failures.

2. The memory card of claim 1, further comprising at least one direct connection between the memory controller on said substrate and said test interface.

3. The memory card of claim 1, further comprising molded material on said substrate, said test interface protruding from said molded material to form an edge connector.

4. The memory card of claim 1, further comprising at least one electrical connection running directly between said main interface and said test interface.

5. The memory card of claim 1, further comprising at least one electrical connection running directly between said main interface and said memory unit, said at least one electrical connection also being electrically connected to said test interface.

6. The memory card of claim 1, further comprising at least one electrical connection running between said memory unit and a controller on said substrate, said electrical connection being also connected to said test interface.

7. The memory card of claim 1, further comprising an electrical connection running from said main interface to both said memory unit and a controller on said substrate, said electrical connection also being connected to said test interface.

8. A memory card comprising:
   a substrate comprising a memory unit;
   means for enclosing said substrate in conformance with a pre-defined size standard for said memory card;
   first means for providing data signals to a host device from said memory card, said first means being disposed on said substrate;
   second means for providing test signals from testing equipment to said memory card to test for field failures, said second means being separate and electrically disconnected from said first means and disposed on said substrate;
   wherein an opening within said means for enclosing exposes said first and second means.

* * * * *